(12) United States Patent
Oshita et al.

(10) Patent No.: US 11,946,294 B2
(45) Date of Patent: Apr. 2, 2024

(54) DOOR HANDLE

(71) Applicant: ALPS ALPINE CO., LTD., Tokyo (JP)

(72) Inventors: Kazuhito Oshita, Miyagi (JP); Daisuke Takai, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 588 days.

(21) Appl. No.: 17/166,284

(22) Filed: Feb. 3, 2021

(65) Prior Publication Data

US 2021/0164270 A1 Jun. 3, 2021

Related U.S. Application Data

(63) Continuation of application No. PCT/JP2019/009771, filed on Mar. 11, 2019.

(30) Foreign Application Priority Data

Aug. 15, 2018 (JP) ................. 2018-152848

(51) Int. Cl.
*H03K 17/96* (2006.01)
*E05B 81/76* (2014.01)
*E05B 85/16* (2014.01)

(52) U.S. Cl.
CPC .............. *E05B 81/77* (2013.01); *E05B 85/16* (2013.01); *H03K 17/9622* (2013.01);
(Continued)

(58) Field of Classification Search
CPC ..... E05B 81/77; E05B 85/16; H03K 17/9622; H03K 2217/96078; H03K 2017/9602;
(Continued)

(56) References Cited

U.S. PATENT DOCUMENTS 8,796,575 B2 * 8/2014 Salter ................. H03K 17/9618
200/600
9,670,702 B2 6/2017 Sugita et al.
(Continued)

FOREIGN PATENT DOCUMENTS

EP 2372914 10/2011
JP H10-308148 11/1998
(Continued)

OTHER PUBLICATIONS

International Search Report for PCT/JP2019/009771 dated May 7, 2019.
(Continued)

*Primary Examiner* — Ahmed M Saeed
(74) *Attorney, Agent, or Firm* — IPUSA, PLLC

(57) ABSTRACT

A door handle including a capacitance sensor configured to detect an operation body is provided. The capacitance sensor includes a substrate formed of an insulator and having a surface, at least one first sensor electrode disposed on the surface of the substrate, a plurality of second sensor electrodes disposed on the surface of the substrate, and a controller. The number of the plurality of second sensor electrodes is greater than the number of the at least one first sensor electrode. The controller applies a voltage to the plurality of second sensor electrodes and detects a coordinate position of the operation body, in a case where a capacitance between the operation body and the at least one first sensor electrode is greater than or equal to a predetermined value.

16 Claims, 16 Drawing Sheets

(52) U.S. Cl.
CPC ....... *E05Y 2201/68* (2013.01); *E05Y 2400/86* (2013.01); *E05Y 2900/531* (2013.01); *H03K 2217/96078* (2013.01)

(58) Field of Classification Search
CPC ........ H03K 2217/96073; H03K 2217/960765; H03K 17/955; H03K 2017/9604; H03K 2217/94036; H03K 2217/94052; H03K 17/962; H03K 2217/94042; E05Y 2201/68; E05Y 2400/86; E05Y 2900/531
See application file for complete search history.

(56) References Cited

U.S. PATENT DOCUMENTS

| | | |
|---|---|---|
| 2014/0285217 A1 | 9/2014 | Van Gastel et al. |
| 2016/0277023 A1 | 9/2016 | Nakajima |
| 2017/0194960 A1* | 7/2017 | Bextermoeller ........ E05B 81/77 |
| 2017/0260778 A1 | 9/2017 | Witte et al. |

FOREIGN PATENT DOCUMENTS

| | | |
|---|---|---|
| JP | 2016-173299 | 9/2016 |
| JP | 6212824 | 10/2017 |
| JP | 2018-003468 | 1/2018 |
| WO | 2014/125577 | 8/2014 |

OTHER PUBLICATIONS

Extended European Search Report for 19849678.8 dated Apr. 8, 2022.

* cited by examiner

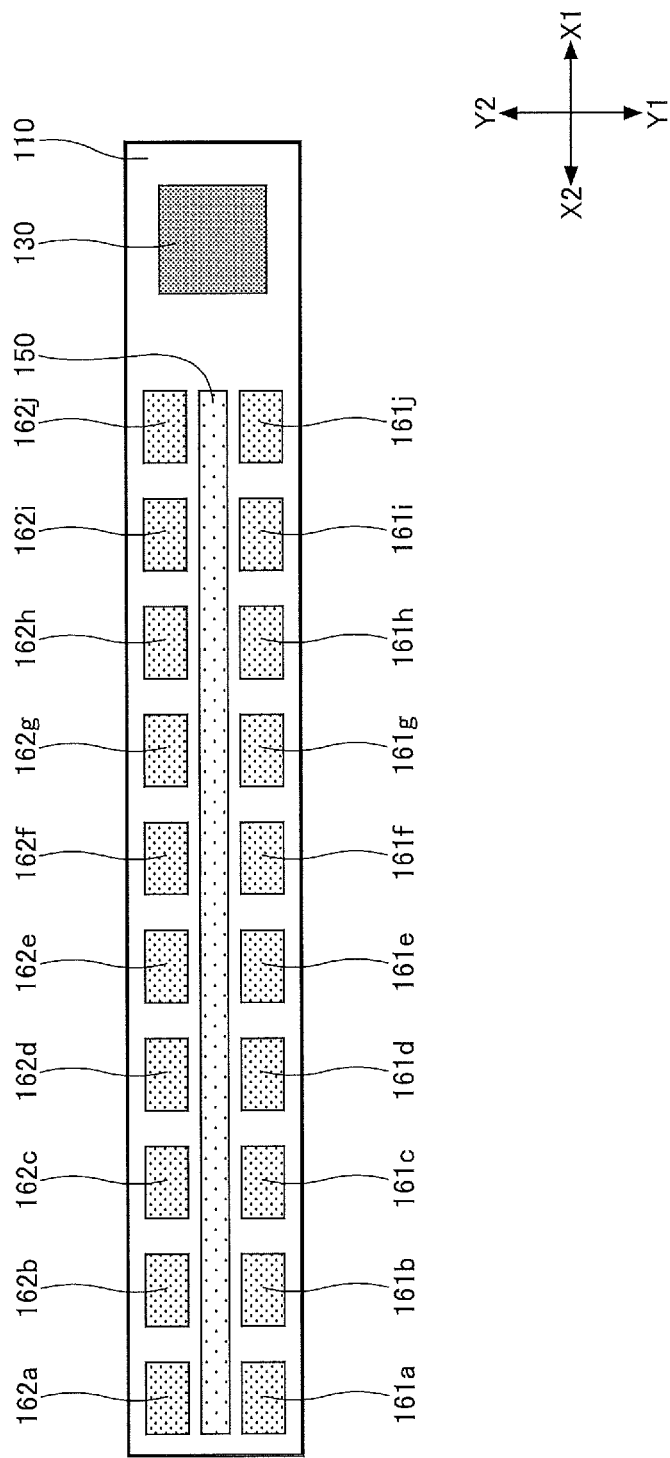

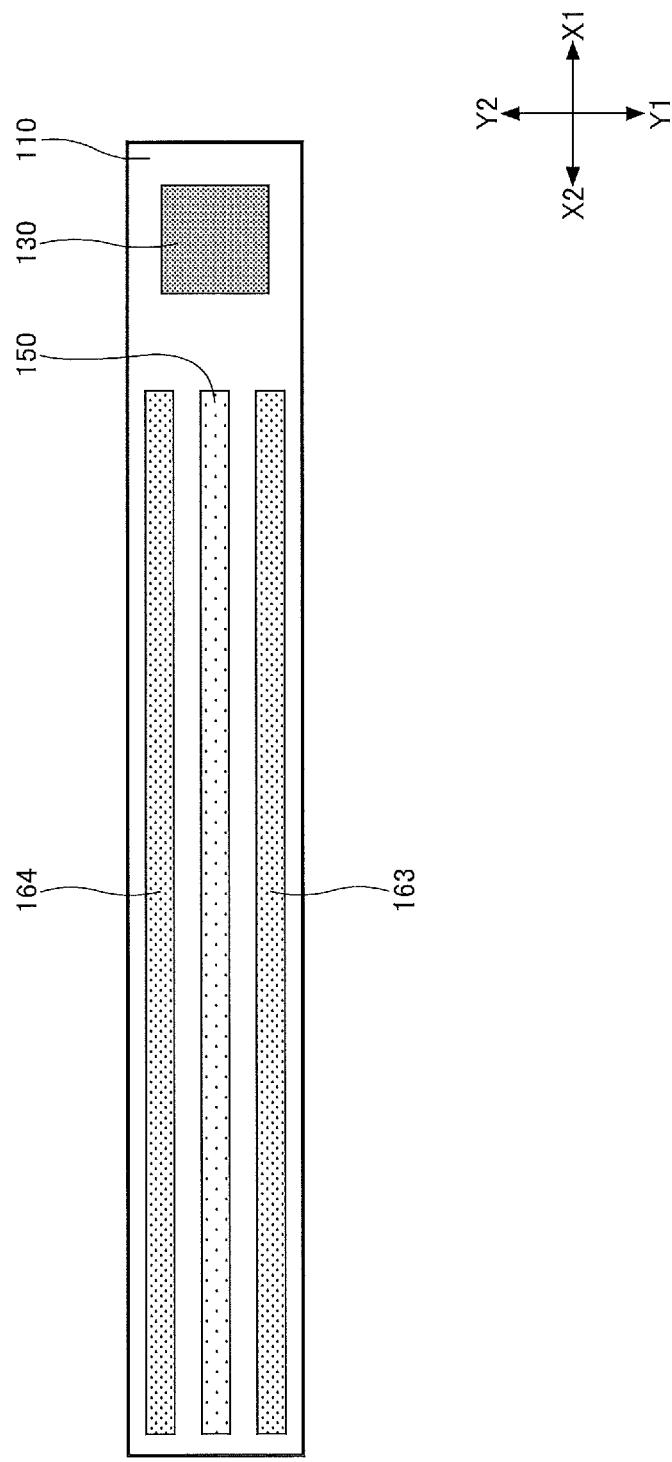

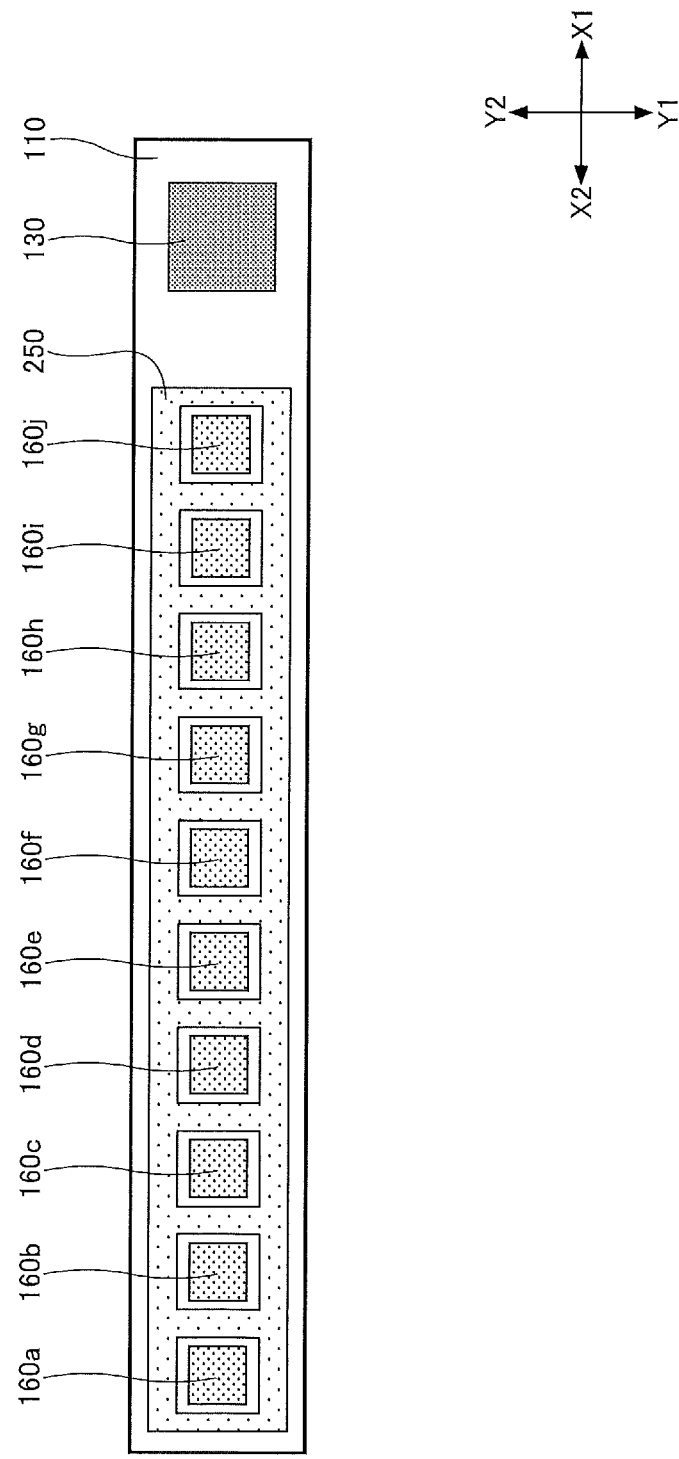

DOOR HANDLE

CROSS-REFERENCE TO RELATED APPLICATIONS

This application is a continuation of International Application No. PCT/JP2019/009771, filed on Mar. 11, 2019 and designating the U.S., which claims priority to Japanese Patent Application No. 2018-152848 filed on Aug. 15, 2018. The contents of these applications are incorporated herein by reference in their entirety.

BACKGROUND OF THE INVENTION

1. Field of the Invention

The disclosures herein relate to a door handle.

2. Description of the Related Art

Door handles for opening and closing doors are attached to the doors of vehicles. In recent years, door handles allowing users to lock and unlock doors by moving the hands near the door handles are known. In such a door handle, a capacitance sensor configured to detect an operation by hand is provided.

A capacitance sensor provided in a door handle is configured to apply a voltage to electrodes disposed in the capacitance sensor and measure capacitances. Therefore, the door handle includes a power source for applying the voltage to the electrodes of the capacitance sensor and an electric circuit for controlling the application of the voltage. In order to drive the capacitance sensor and the electric circuit, power is supplied from a battery of a vehicle such as an automobile to the capacitance sensor and the electric circuit. However, as the power of the battery is limited, it is preferable to reduce the power consumed by the capacitance sensor and the electric circuit of the door handle.

RELATED-ART DOCUMENTS

Patent Documents

Patent Document 1: Japanese Laid-Open Patent Publication No. 10-308148
Patent Document 2: WO2014/125577

SUMMARY OF THE INVENTION

It is desirable to provide a door handle equipped with a capacitance sensor that can be driven with low power consumption.

According to at least one embodiment, a door handle including a capacitance sensor configured to detect an operation body is provided. The capacitance sensor includes a substrate formed of an insulator and having a surface, at least one first sensor electrode disposed on the surface of the substrate, a plurality of second sensor electrodes disposed on the surface of the substrate, and a controller. The number of the plurality of second sensor electrodes is greater than the number of the at least one first sensor electrode. The controller applies a voltage to the plurality of second sensor electrodes and detects a coordinate position of the operation body, in a case where a capacitance between the operation body and the at least one first sensor electrode is greater than or equal to a predetermined value.

BRIEF DESCRIPTION OF THE DRAWINGS

Other objects and further features of the present invention will be apparent from the following detailed description when read in conjunction with the accompanying drawings, in which:

FIG. 14 is a diagram (5) illustrating a variation of the capacitance sensor according to the first embodiment;
FIG. 15 is a diagram (6) illustrating a variation of the capacitance sensor according to the first embodiment;
and
FIG. 16 is a diagram illustrating a capacitance sensor according to a second embodiment.

DESCRIPTION OF THE EMBODIMENTS

Figure 1:
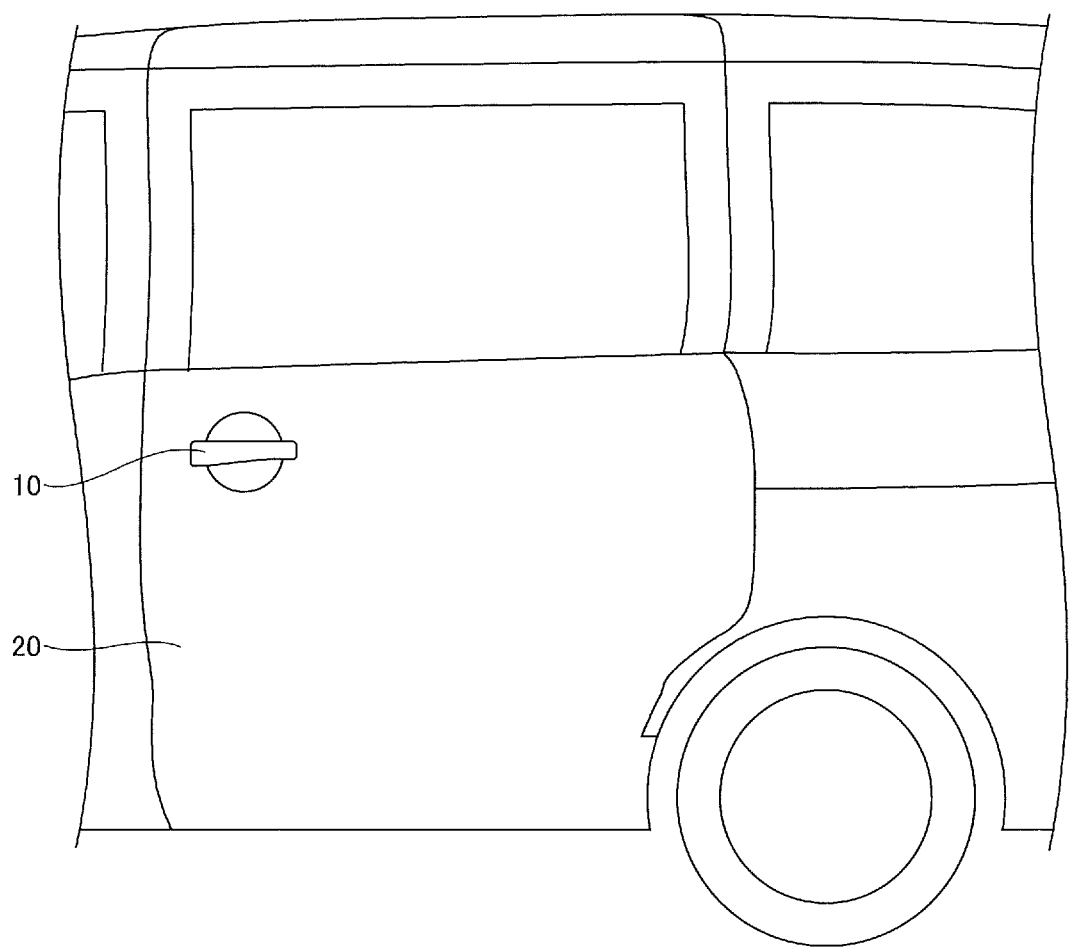
FIG. 1 is a diagram illustrating a door to which a door handle according to a first embodiment is attached.

According to at least one embodiment, a door handle equipped with a capacitance sensor can be driven at low power consumption.

In the following, embodiments will be described. The same members are denoted by the same reference numerals, and a description thereof will not be repeated. Further, in the present application, an X1-X2 direction, a Y1-Y2 direction, and a Z1-Z2 direction are mutually perpendicular directions. Further, a plane including the X1-X2 direction and the Y1-Y2 direction is referred to as an XY-plane, a plane including the Y1-Y2 direction and the Z1-Z2 direction is referred to as a YZ-plane, and a plane including the Z1-Z2 direction and the X1-X2 direction is referred to as a ZX-plane.

First Embodiment

Figure 2:
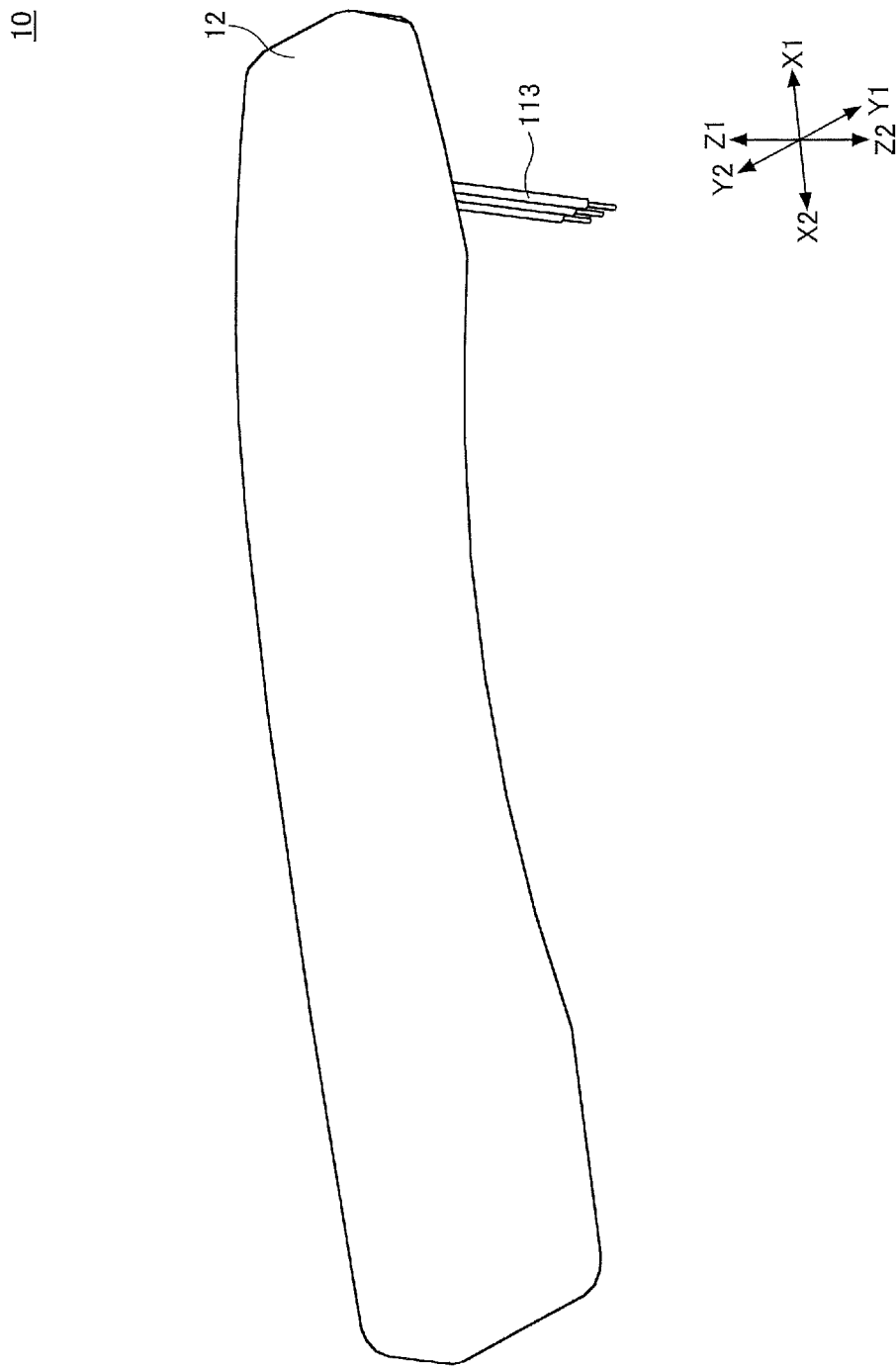
FIG. 2 is a perspective view of the door handle according to the first embodiment.
Figure 3:
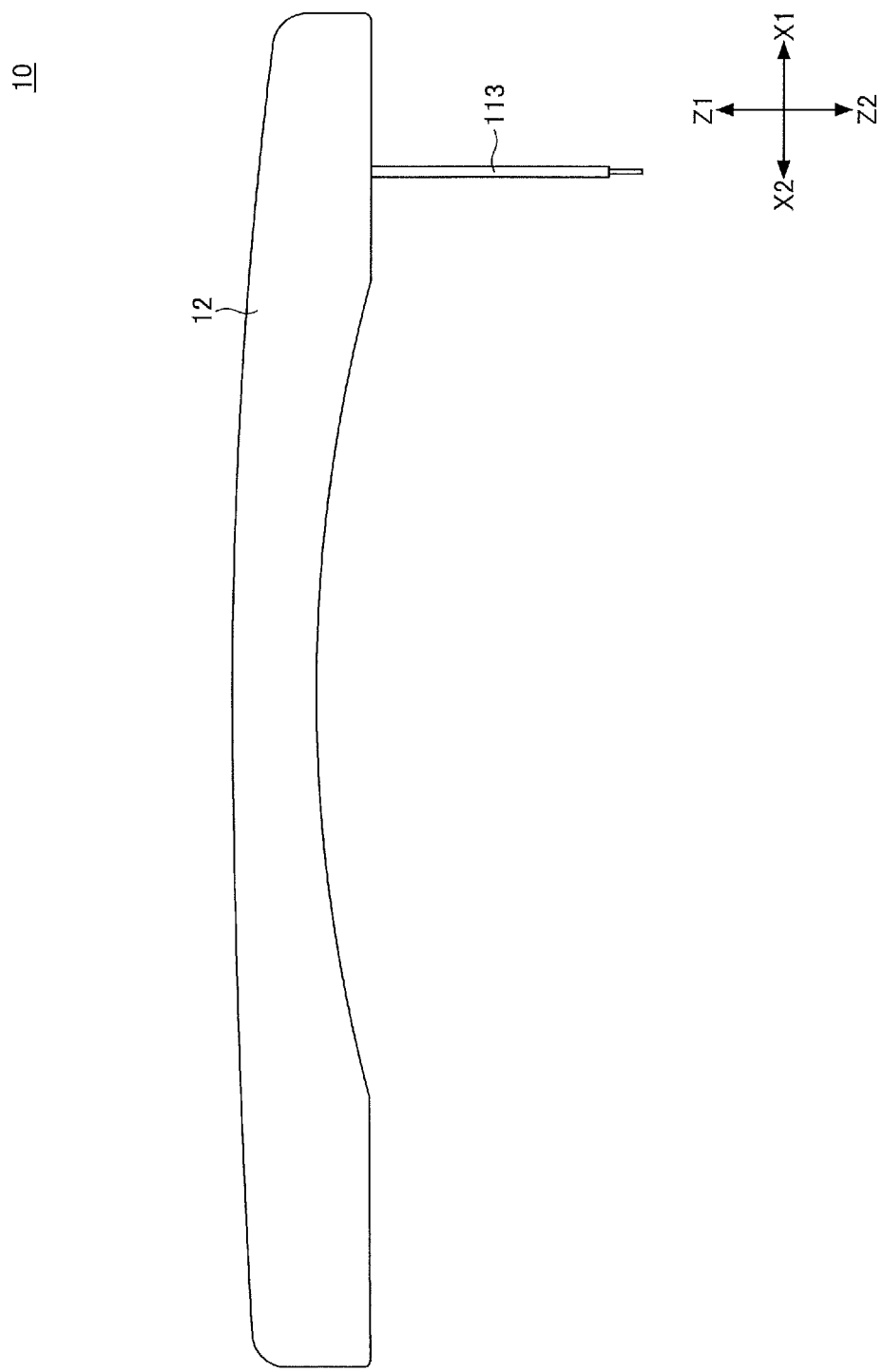
FIG. 3 is a top view of the door handle according to the first embodiment.
Figure 4:
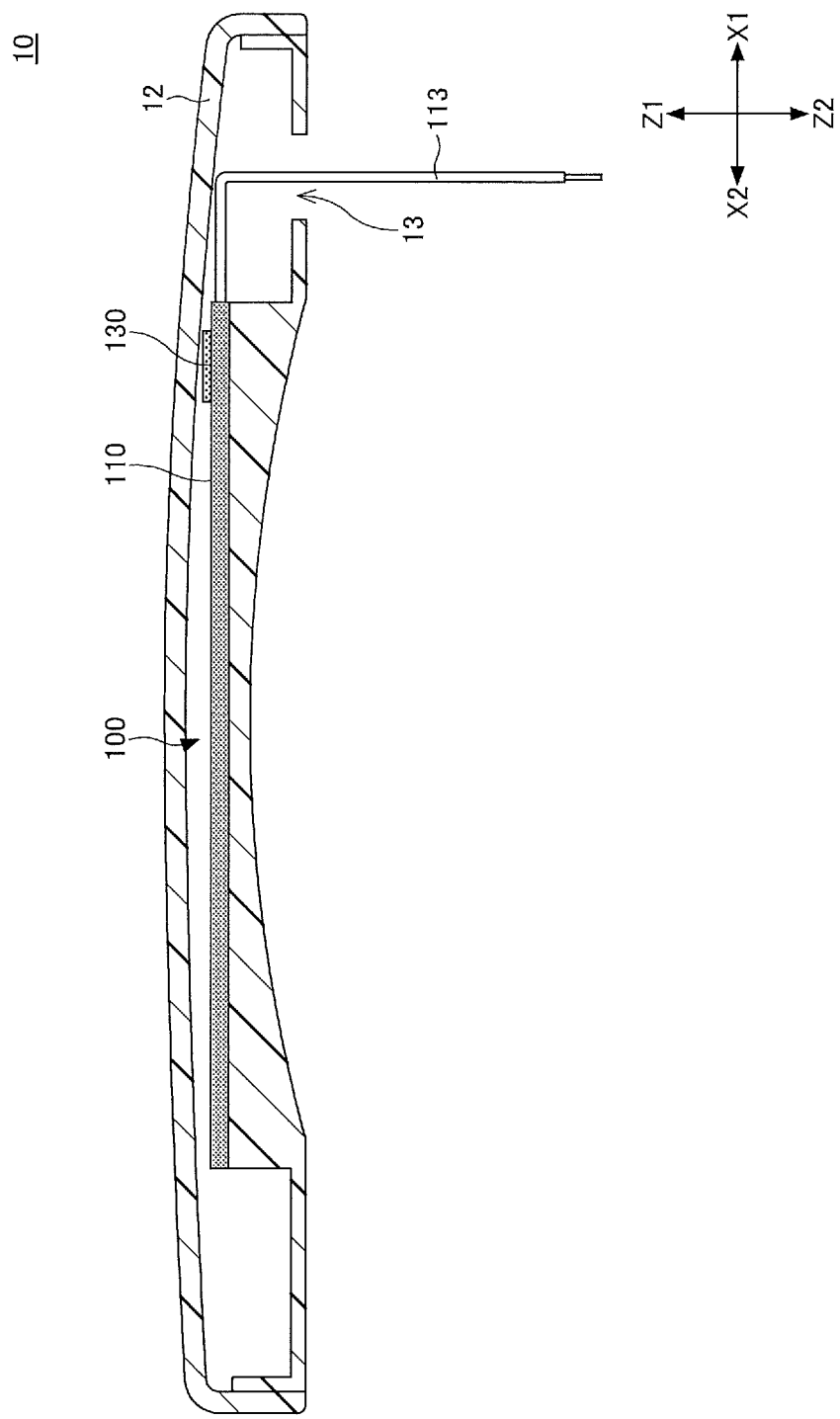
FIG. 4 is a cross-sectional view of the door handle according to the first embodiment.

A door handle 10 according to a first embodiment is attached to a door 20 of a vehicle such as an automobile as illustrated in FIG. 1. As illustrated in FIG. 2 through FIG. 4, the door handle 10 includes a door handle case 12 and a capacitance sensor 100 provided within the door handle case 12. The door handle case 12 has a curved outer surface such that a user can readily grasp the door handle 10 with the hand. FIG. 2 is a perspective view of the door handle 10.

FIG. 3 is a top view of the door handle 10. FIG. 4 is a cross-sectional view of the door handle 10.

Although not illustrated in FIG. 4, in the capacitance sensor 100, a flat substrate 110 formed of an insulator and having an approximately rectangular shape is disposed, and electrodes for detection of capacitances are formed inside or on the surface of the substrate 110. When the longitudinal direction of the door handle 10 is the X1-X2 direction, the longitudinal direction of the substrate 110 of the capacitance sensor 100 provided within the door handle case 12 is also the X1-X2 direction, and the surface of the substrate 110 of the capacitance sensor 100 is approximately parallel to the XY-plane. A through-hole 13 is provided through the door handle case 12 in order to pass wiring 113 connected to the capacitance sensor 100. The wiring 113 is provided for electrically connecting the electrostatic sensor 100 to the exterior of the door handle 10. Further, an integrated circuit 130 is mounted on the substrate 110. The integrated circuit 130 serves as a controller configured to control the capacitance sensor 100.

Figure 5:
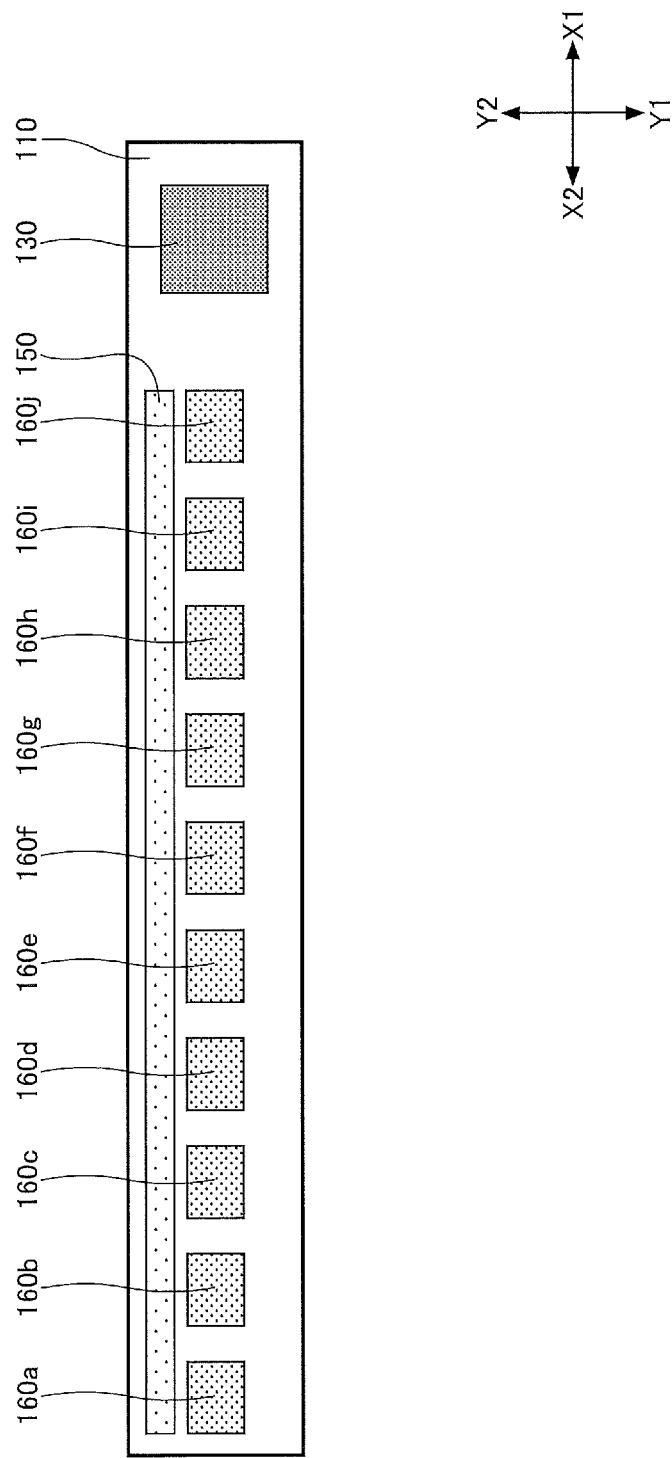
FIG. 5 is a diagram illustrating a capacitance sensor according to the first embodiment.

Next, the capacitance sensor 100 according to the present embodiment will be described. As illustrated in FIG. 5, the capacitance sensor 100 according to the present embodiment includes a first sensor electrode 150 and a plurality of second sensor electrodes 160a, 160b, 160c, 160d, 160e, 160f, 160g, 160h, 160i, and 160j formed on the surface of the substrate 110.

The first sensor electrode 150 is formed on the Y2 side of the substrate 110, and is elongated in the X1-X2 direction. The second sensor electrodes 160a, 160b, 160c, 160d, 160e, 160f, 160g, 160h, 160i, and 160j are formed on the Y1 side of the substrate 110 relative to the first sensor electrode 150, and are regularly arranged in a line at approximately equal intervals from the X2 side to the X1 side. In the capacitance sensor 100 according to the present embodiment, the first sensor electrode 150 detects whether a user's finger 200 approaches the capacitance sensor 100, and the second sensor electrodes 160a, 160b, 160c, 160d, 160e, 160f, 160g, 160h, 160i, and 160j detect the position of the finger 200.

Specifically, in the capacitance sensor 100 according to the present embodiment, the first sensor electrode 150 detects whether the finger 200 approaches the capacitance sensor 100. When the first sensor electrode 150 detects that the finger 200 has approached the capacitance sensor 100, a voltage is applied to the second sensor electrodes 160a, 160b, 160c, 160d, 160e, 160f, 160g, 160h, 160i, and 160j in order to detect the position of the finger 200. The voltage is not applied to the second sensor electrodes 160a, 160b, 160c, 160d, 160e, 160f, 160g, 160h, 160i, and 160j until the first sensor electrode 150 detects that the finger 200 has approached the capacitance sensor 100. In general, in a capacitance sensor, as the number of electrodes to which a voltage is applied decreases, the power consumed by an integrated circuit decreases.

In the present embodiment, a voltage is applied to the first sensor electrode only, until the finger approaches the capacitance sensor 100, thus allowing power consumption to be reduced. In particular, when the door handle 10 is attached to a door of an automobile, there may be a case where the user's finger 200 does not approach the door handle 10 for a long time. Therefore, the door handle 10 that includes the capacitance sensor 100 according to the present embodiment is advantageous in reducing power consumption.

The capacitance sensor 100 according to the present embodiment may include a plurality of first sensor electrodes; however, the number of first sensor electrodes is preferably less than the number of second sensor electrodes. In other words, the number of second sensor electrodes is preferably greater than the number of first sensor electrodes. Further, one first sensor electrode is preferably used in terms of reducing power consumption.

In the capacitance sensor 100 according to the present embodiment, the first sensor electrode 150 and the second sensor electrodes 160a, 160b, 160c, 160d, 160e, 160f, 160g, 160h, 160i, and 160j are connected to the integrated circuit 130. Note that FIG. 5 does not depict wiring that connects the first sensor electrode 150 and the second sensor electrodes 160a, 160b, 160c, 160d, 160e, 160f, 160g, 160h, 160i, and 160j to the integrated circuit 130.

Figure 6:
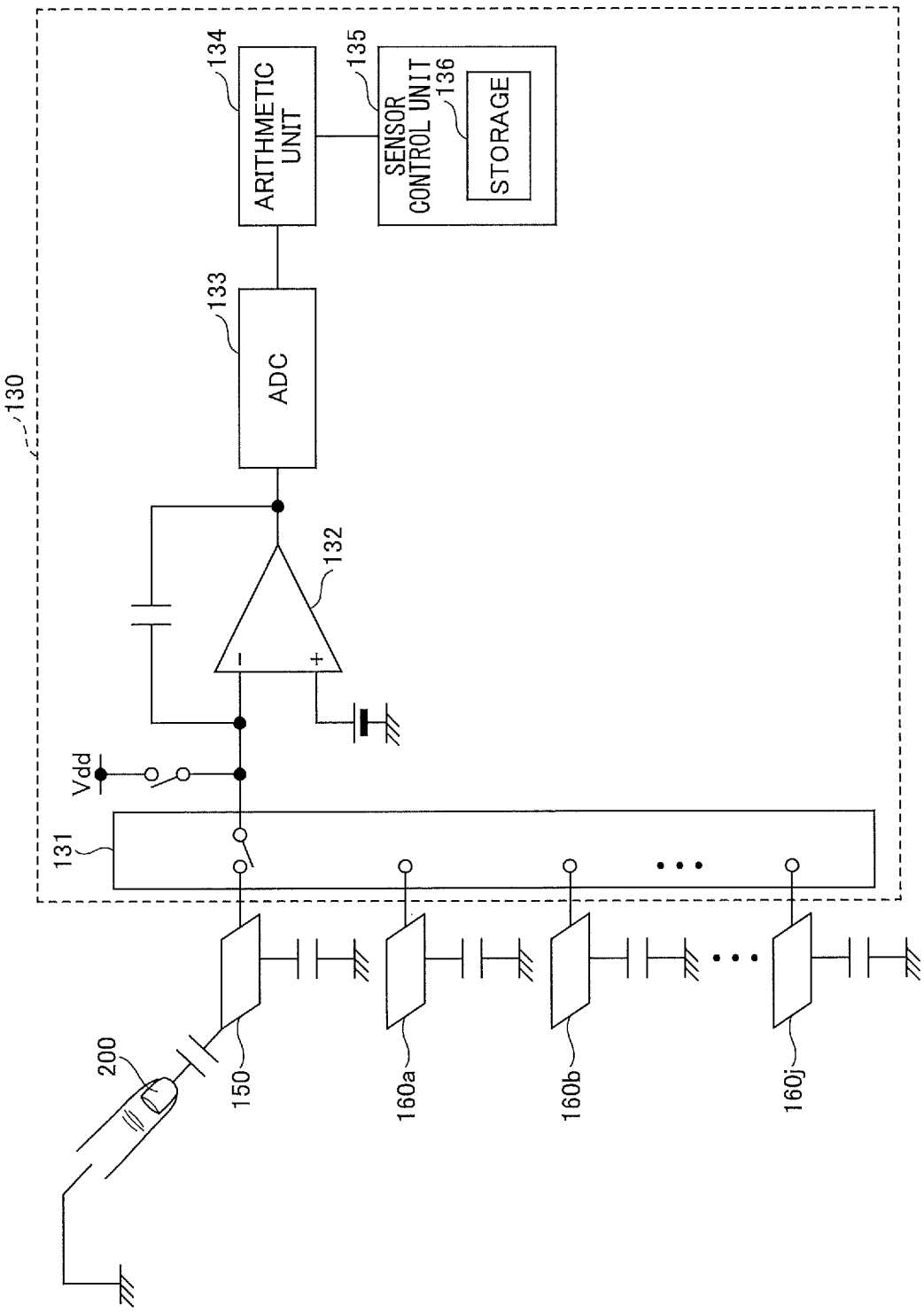
FIG. 6 is a diagram illustrating a configuration of a controller that controls the capacitance sensor according to the first embodiment.

Specifically, as illustrated in FIG. 6, the integrated circuit 130 includes a switch 131 that is connected to each of the first sensor electrode 150 and the second sensor electrodes 160a, 160b, 160c, 160d, 160e, 160f, 160g, 160h, 160i, and 160j. By closing the switch 131, a predetermined voltage Vdd can be applied to the first sensor electrode 150 and the second sensor electrodes 160a, 160b, 160c, 160d, 160e, 160f, 160g, 160h, 160i, and 160j. Accordingly, the potential of each of the first sensor electrode 150 and the second sensor electrodes 160a, 160b, 160c, 160d, 160e, 160f, 160g, 160h, 160i, and 160j can be detected. Then, the detected potential is amplified by an amplifier 132, and an analog signal is converted to a digital signal by an analog-to-digital converter (ADC) 133. Based on the digital signal converted as described above, an arithmetic unit 134 can calculate the capacitance between the finger 200 and each of the sensor electrodes 150, 160a, 160b, 160c, 160d, 160e, 160f, 160g, 160h, 160i, and 160j. Information of the calculated capacitance between the finger 200 and each of the sensor electrodes 150, 160a, 160b, 160c, 160d, 160e, 160f, 160g, 160h, 160i, and 160j is transmitted to a sensor control unit 135. The sensor control unit 135 includes a storage 136 that stores various information.

As used herein, the finger 200 may be referred to as an "operation body" because an operation is performed by the finger 200.

(Detection Process by Capacitance Sensor)

Next, a process for detecting the position of the finger by the capacitance sensor 100 according to the present embodiment will be described.

First, in step 102 (S102), a predetermined voltage Vdd is applied to the first sensor electrode 150 as controlled by the integrated circuit 130. At this time, no voltage is applied to the second sensor electrodes 160a, 160b, 160c, 160d, 160e, 160f, 160g, 160h, 160i, and 160j.

Next, in step 104 (S104), while the predetermined voltage Vdd is being applied to the first sensor electrode 150, the capacitance is measured at the first sensor electrode 150, and it is determined whether the measured capacitance is greater than or equal to a predetermined value. If the finger 200 approaches the capacitance sensor 100, the capacitance between the finger 200 and the first sensor electrode 150 increases. Therefore, if the capacitance measured at the first sensor electrode 150 is greater than or equal to the predetermined value, it is determined that the user's finger 200 has approached the capacitance sensor 100. Accordingly, if it is determined that the capacitance measured at the first sensor electrode 150 is greater than or equal to the predetermined value, the process proceeds to step 106. Conversely, if it is determined that the capacitance measured at the first sensor electrode 150 is less than the predetermined value, the step 104 is repeated.

Next, in step 106 (S106), the predetermined voltage Vdd is applied to the second sensor electrodes 160a, 160b, 160c, 160d, 160e, 160f, 160g, 160h, 160i, and 160j, and capacitances are measured at the second sensor electrodes 160a, 160b, 160c, 160d, 160e, 160f, 160g, 160h, 160i, and 160j. At this time, a predetermined bias voltage may be applied to the first sensor electrode 150 such that the first sensor electrode 150 functions as a guard voltage that minimizes the influence of noise.

Figure 8:
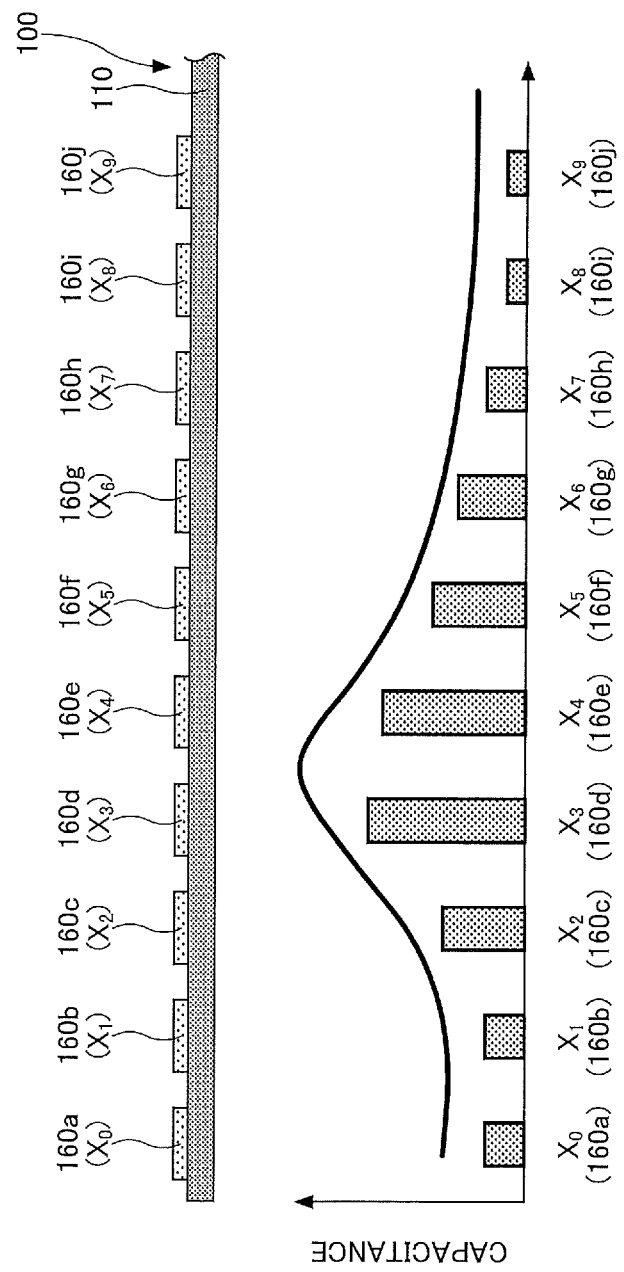
FIG. 8 is a diagram illustrating the detection process by the capacitance sensor according to the first embodiment.

Next, in step 108 (S108), the position of the finger 200 is detected based on the capacitances measured at the second sensor electrodes 160a, 160b, 160c, 160d, 160e, 160f, 160g, 160h, 160i, and 160j in step 106. Specifically, if the user's finger 200 approaches the capacitance sensor 100, capacitances as indicated in FIG. 8 are measured at the second sensor electrodes 160a, 160b, 160c, 160d, 160e, 160f, 160g, 160h, 160i, and 160j. The second sensor electrodes 160a, 160b, 160c, 160d, 160e, 160f, 160g, 160h, 160i, and 160j are arranged at equal intervals in the X-axis direction. Therefore, the X-coordinate position of the second sensor electrode 160a is Xo, the X-coordinate position of the second sensor electrode 160b is $X_1$, the X-coordinate position of the second sensor electrode 160c is $X_2$, the X-coordinate position of the second sensor electrode 160d is $X_3$, the X-coordinate position of the second sensor electrode 160e is $X_4$, the X-coordinate position of the second sensor electrode 160f is $X_5$, the X-coordinate position of the second sensor electrode 160g is $X_6$ the X-coordinate position of the second sensor electrode 160h is $X_7$, the X-coordinate position of the second sensor electrode 160i is $X_8$, and the X-coordinate position of the second sensor electrode 160j is $X_9$.

The capacitance is inversely proportional to the distance. Therefore, among the second sensor electrodes, a second sensor electrode having the highest capacitance value is located closest to the finger 200, and the X-coordinate position of the second sensor electrode having the highest capacitance value corresponds to the X-coordinate position of the finger 200. Accordingly, in the example illustrated in FIG. 8, the capacitance value of the second sensor electrode 160d is the highest, and thus, the X-coordinate position "$X_3$" of the second sensor electrode 160d corresponds to the X-coordinate position of the finger 200. Further, in the example illustrated in FIG. 8, the second sensor electrode 160e has the next highest capacitance value. Therefore, it may be considered that the X-coordinate position of the finger 200 is between the X-coordinate position "$X_3$" of the second sensor electrode 160d and the X-coordinate position "$X_4$" of the second sensor electrode 160e.

(Calibration)

Figure 7:
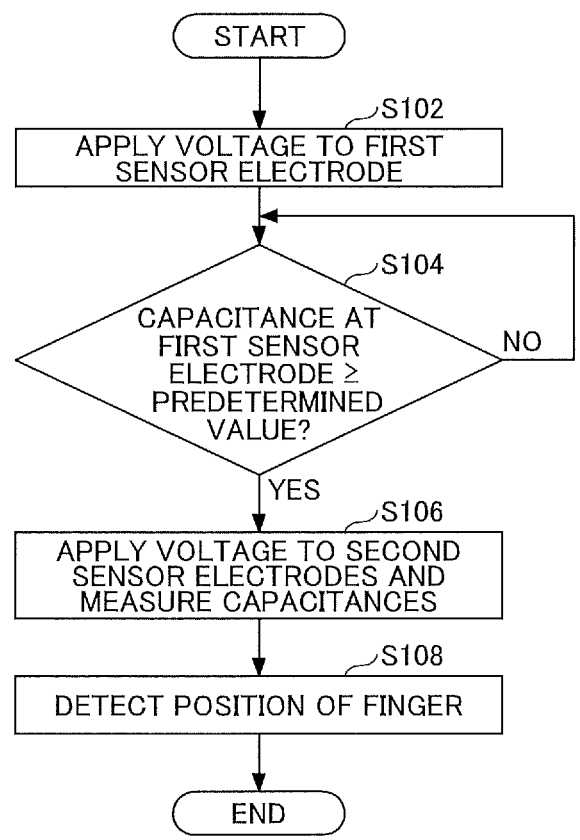
FIG. 7 is a flowchart of a detection process by the capacitance sensor according to the first embodiment.

Next, in-use calibration of the second sensor electrodes 160a, 160b, 160c, 160d, 160e, 160f, 160g, 160h, 160i, and 160j of the electrostatic sensor 100 according to the present embodiment will be described with reference to FIG. 9. In the capacitance sensor 100 according to the present embodiment, the second sensor electrodes 160a, 160b, 160c, 160d, 160e, 160f, 160g, 160h, 160i, and 160j are not driven until the first sensor electrode 150 detects that the user's finger 200 has approached the capacitance sensor 10. Therefore, in the case of a long time until start of measurements using the second sensor electrodes 160a, 160b, 160c, 160d, 160e, 160f, 160g, 160h, 160i, and 160j, values measured from respective electrodes might deviate. For this reason, in the present embodiment, while there is no detection of approach of the finger 200 by the first sensor electrode 150 in the repeated steps 102 and 104 of FIG. 7, the predetermined voltage Vdd is applied at regular intervals to the second sensor electrodes 160a, 160b, 160c, 160d, 160e, 160f, 160g, 160h, 160i, and 160j, and calibration is performed such that capacitance values to be measured at the second sensor electrodes 160a, 160b, 160c, 160d, 160e, 160f, 160g, 160h, 160i, and 160j are consistent. While the approach of the finger 200 is not being detected by the first sensor electrode 150, the finger 200 is not located in the vicinity of the capacitance sensor 100, that is, no object affecting capacitance is present in the vicinity of the capacitance sensor 100. Accordingly, it is preferable to perform in-use calibration during this time.

Figure 9:
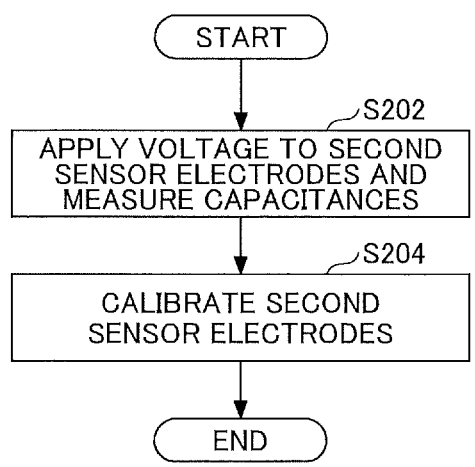
FIG. 9 is a flowchart of calibration by the capacitance sensor according to the first embodiment.

Specifically, as illustrated in FIG. 9, first, in step 202 (S202), the predetermined voltage Vdd is applied to the second sensor electrodes 160a, 160b, 160c, 160d, 160e, 160f, 160g, 160h, 160i, and 160j, and capacitance values are measured at the second sensor electrodes 160a, 160b, 160c, 160d, 160e, 160f, 160g, 160h, 160i, and 160j.

Next, in step 204 (S204), the second sensor electrodes 160a, 160b, 160c, 160d, 160e, 160f, 160g, 160h, 160i, and 160j are calibrated based on the capacitance values measured at the second sensor electrodes 160a, 160b, 160c, 160d, 160e, 160f, 160g, 160h, 160i, and 160j in step 202.

(Variations)

In the following, variations of the capacitance sensor according to the first embodiment will be described. Note that wiring that connects first sensor electrodes and second sensor electrodes to an integrated circuit is not depicted in the drawings.

Figure 10:
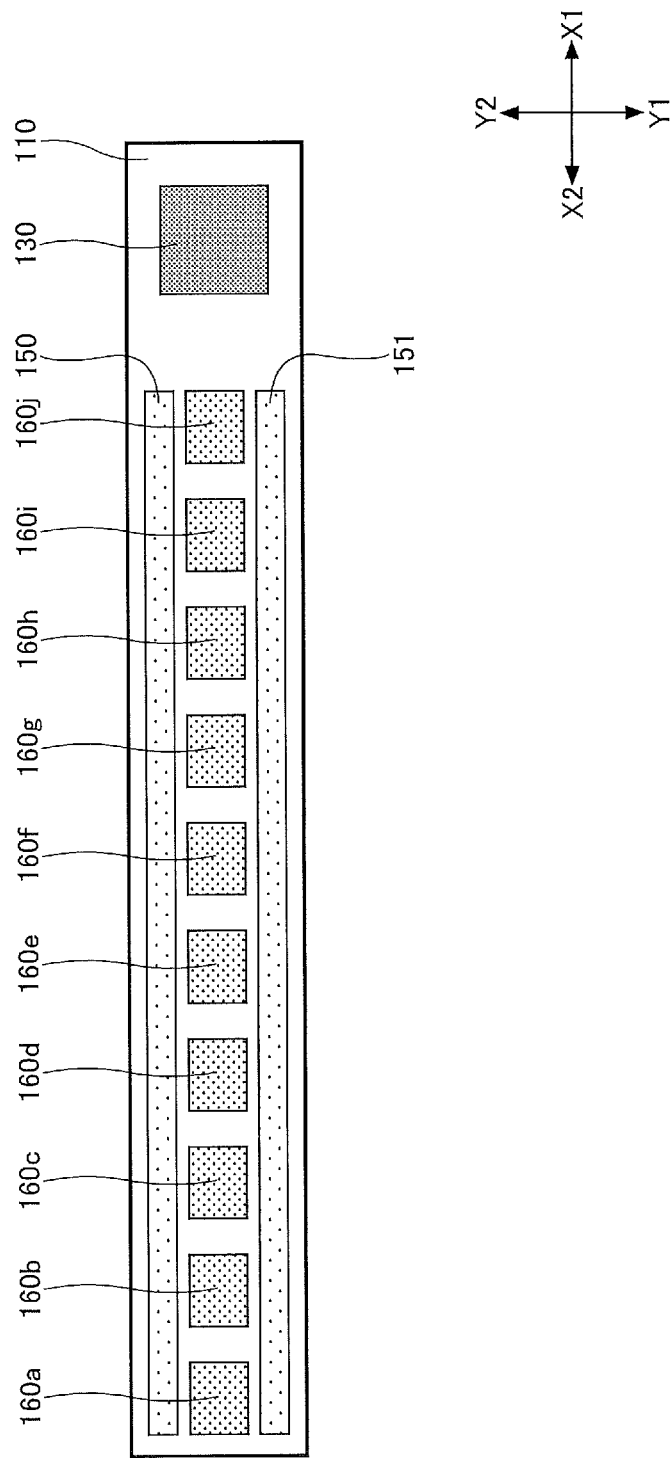
FIG. 10 is a diagram (1) illustrating a variation of the capacitance sensor according to the first embodiment.

In a capacitance sensor as illustrated in FIG. 10, a first sensor electrode 150 may be formed on the Y2 side of second sensor electrodes 160a, 160b, 160c, 160d, 160e, 160f, 160g, 160h, 160i, and 160j, and a first sensor electrode 151 may be formed on the Y1 side of the second sensor electrodes 160a, 160b, 160c, 160d, 160e, 160f, 160g, 160h, 160i, and 160j. Further, the longitudinal direction of each of the first sensor electrode 150 and the first sensor electrode 151 is the X1-X2 direction. With this configuration, the second sensor electrodes 160a, 160b, 160c, 160d, 160e, 160f, 160g, 160h, 160i, and 160j may be arranged in the X1-X2 direction between the first sensor electrode 150 and the first sensor electrode 151. Accordingly, by disposing the first sensor electrodes 150 and 151, the finger 200 approaching not only from the Y2 side but also from the Y1 side can be detected. As a result, the detection accuracy of the capacitance sensor can be improved. Further, when capacitance values are measured at the second sensor electrodes 160a, 160b, 160c, 160d, 160e, 160f, 160g, 160h, 160i, and 160j, a predetermined bias voltage may be applied to the first sensor electrodes 150 and 151 such that the first sensor electrodes 150 and 151 function as guard voltages that minimize the influence of noise.

Figure 11:
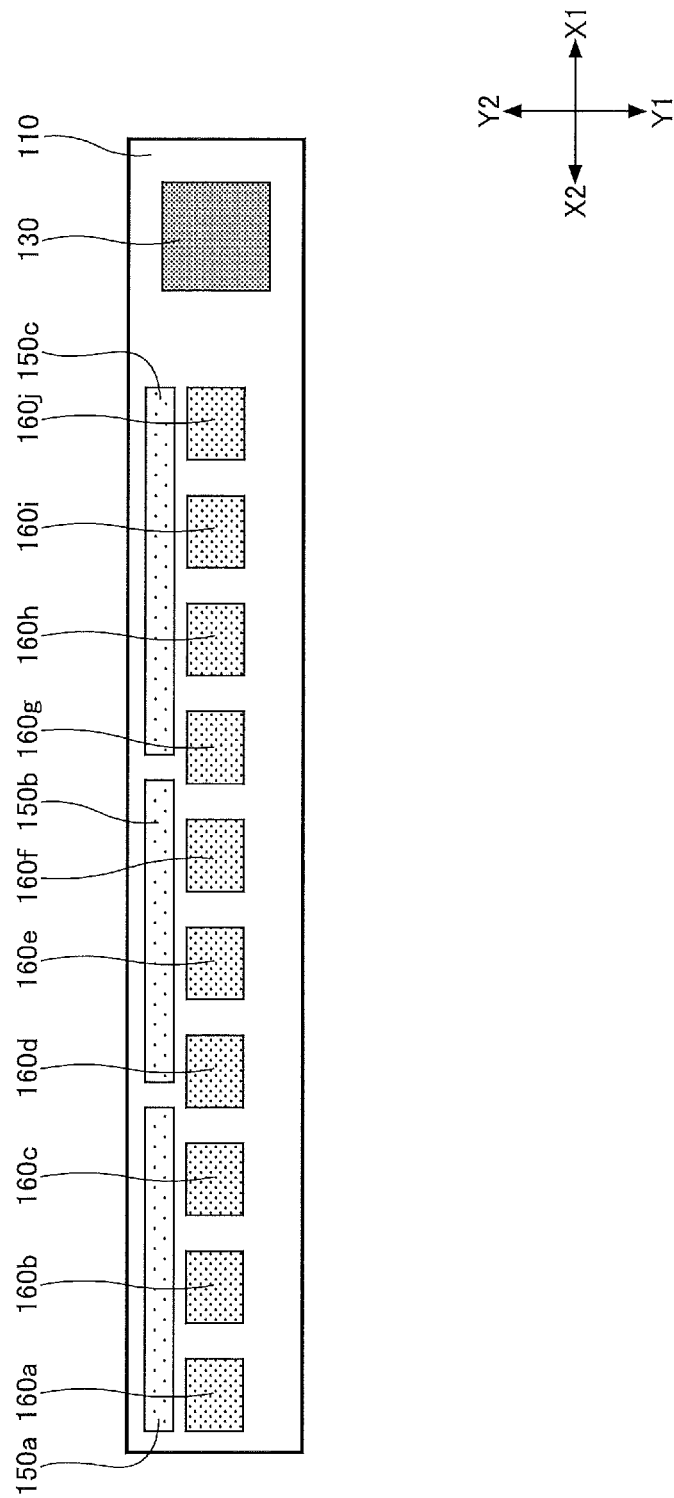
FIG. 11 is a diagram (2) illustrating a variation of the capacitance sensor according to the first embodiment.

Further, as illustrated in FIG. 11, the first sensor electrode 150 illustrated in FIG. 5 may be divided into three first sensor electrodes 150a, 150b, and 150c.

Figure 12:
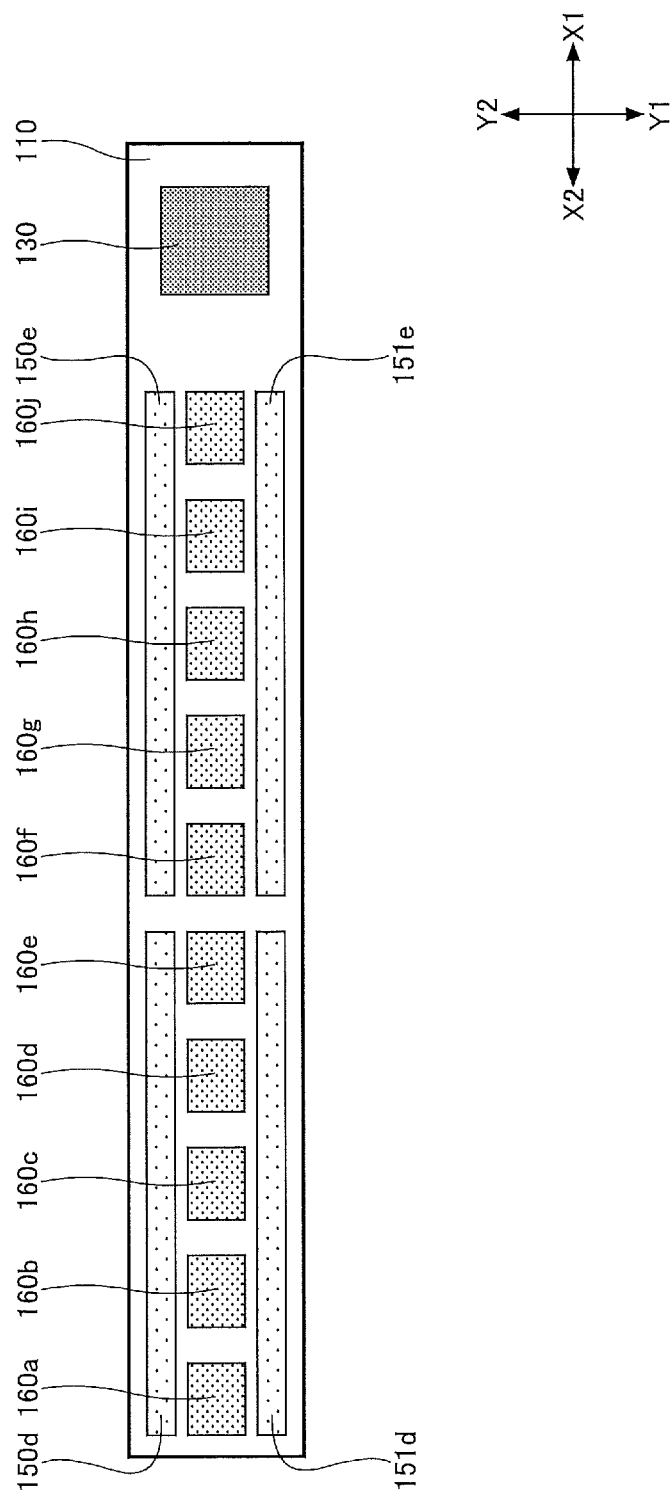
FIG. 12 is a diagram (3) illustrating a variation of the capacitance sensor according to the first embodiment.

Further, as illustrated in FIG. 12, the first sensor electrode 150 illustrated in FIG. 10 may be divided into two first sensor electrodes 150d and 150e, and the first sensor electrode 151 illustrated in FIG. 10 may be divided into two first sensor electrodes 151d and 151e.

Figure 13:
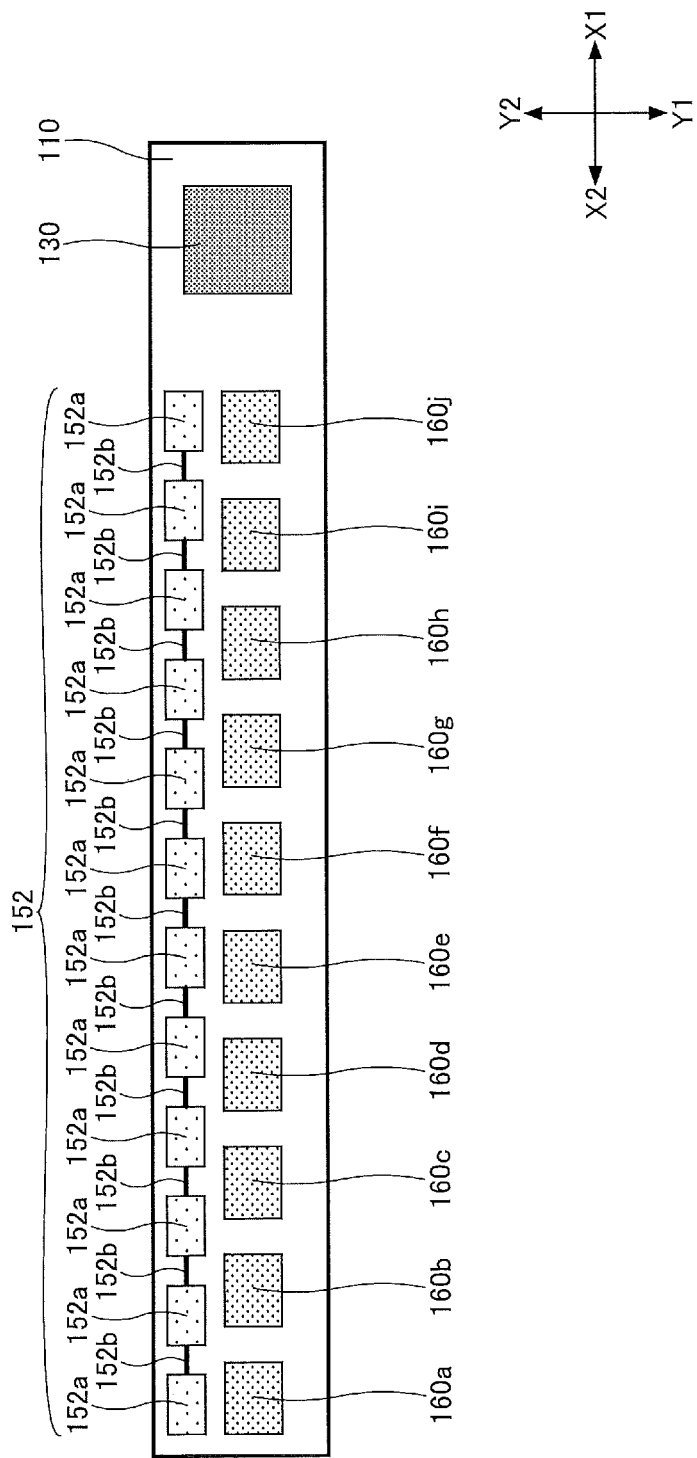
FIG. 13 is a diagram (4) illustrating a variation of the capacitance sensor according to the first embodiment.

Further, as illustrated in FIG. 13, an electrode 152 may be divided into a plurality of electrodes 152a that are connected by wiring 152b in the X1-X2 direction.

Further, as illustrated in FIG. 14, a first sensor electrode 150, whose longitudinal direction is the X1-X2 direction, may be formed at the center in the Y1-Y2 direction of the substrate 110, second sensor electrodes 161a, 161b, 161c, 161d, 161e, 161f, 161g, 161h, 161i, and 161j may be arranged on the Y1 side of the first sensor electrode 150 in the X1-X2 direction, and second sensor electrodes 162a, 162b, 162c, 162d, 162e, 162f, 162g, 162h, 162i, and 162j may be arranged on the Y2 side of the first sensor electrode 150 in the X1-X2 direction. In this case, the position in the Y-axis direction of the finger 200 can also be detected by the second sensor electrodes 161a through 161j and the second sensor electrodes 162a through 162j.

Further, as illustrated in FIG. 15, the first sensor electrode 150, whose longitudinal direction is the X1-X2 direction, may be formed at the center in the Y1-Y2 direction of the substrate 110, a second sensor electrode 163, whose longitudinal direction is the X1-X2 direction, may be formed on the Y1 side of the first sensor electrode 150, and a second sensor electrode 164, whose longitudinal direction is the X1-X2 direction, may be formed on the Y2 side of the first sensor electrode 150. In this case, although the sensor electrodes are driven in a different manner to that described above, the position in the Y-axis direction of the finger 200 can also be detected by the second sensor electrode 163, the second sensor electrode 164, and the first sensor electrode 150.

Second Embodiment

Next, a second embodiment will be described. In the second embodiment, as illustrated in FIG. 16, a plurality of second sensor electrodes 160a, 160b, 160c, 160d, 160e, 160f, 160g, 160h, 160i, and 160j may be surrounded by a first sensor electrode 250. By forming the first sensor electrode 250 as described above, the first sensor electrode 250 can effectively function as a guard voltage that minimizes the influence of noise.

Other configurations of the second embodiment are the same as those of the first embodiment.

Although specific embodiments have been described above, the present invention is not limited to the above-described embodiments. Variations and modifications may be made to the described subject matter without departing from the scope of the invention as set forth in the accompanying claims.

What is claimed is:

1. A door handle comprising,
a capacitance sensor configured to detect an operation body, wherein the capacitance sensor includes:
a substrate formed of an insulator and having a surface;
at least one first sensor electrode disposed on the surface of the substrate;
a plurality of second sensor electrodes disposed on the surface of the substrate; and
a controller,
wherein a number of the plurality of second sensor electrodes is greater than a number of the at least one first sensor electrode,
wherein the controller applies a voltage to the plurality of second sensor electrodes and detects a coordinate position of the operation body, in a case where a capacitance between the operation body and the at least one first sensor electrode is greater than or equal to a predetermined value,
wherein, in a case where the capacitance between the operation body and the at least one first sensor electrode is less than the predetermined value, the controller does not apply the voltage to the plurality of second sensor electrodes, and
wherein, in a case where the capacitance between the operation body and the at least one first sensor electrode is less than the predetermined value, the controller applies the voltage to the plurality of second sensor electrodes, and performs calibration such that capacitance values at the plurality of second sensor electrodes are consistent.

2. The door handle according to claim 1, wherein a longitudinal direction of the at least one first sensor electrode is same as an arrangement direction of the plurality of second sensor electrodes.

3. The door handle according to claim 1, wherein the plurality of second sensor electrodes are regularly arranged at equal intervals.

4. The door handle according to claim 1, wherein, in the case where the capacitance between the operation body and the at least one first sensor electrode is less than the predetermined value, the controller does not apply the voltage to the plurality of second sensor electrodes except when the controller performs the calibration.

5. The door handle according to claim 1, wherein, in the case where the capacitance between the operation body and the at least one first sensor electrode is greater than or equal to the predetermined value, the controller applies a predetermined bias voltage to the at least one first sensor electrode.

6. The door handle according to claim 1, wherein the controller detects the coordinate position of the operation body based on a second sensor electrode having a highest capacitance value, among the plurality of second sensor electrodes.

7. The door handle according to claim 1, wherein the number of the at least one first sensor electrode is one or two.

8. The door handle according to claim 1, wherein each of the plurality of the second sensor electrodes is arranged so as to be adjacent to the at least one first sensor electrode.

9. The door handle according to claim 8, wherein the number of first sensor electrodes is an even number, and each of the plurality of the second sensor electrodes is arranged between two of the first sensor electrodes.

10. The door handle according to claim 9, wherein each of the first sensor electrodes is divided into two divided first sensor electrodes, and each of the plurality of the second sensor electrodes is arranged between two of the divided first sensor electrodes.

11. The door handle according to claim 8, wherein the number of first sensor electrodes is two or more, and the first sensor electrodes are linearly arranged in a longitudinal direction of the substrate.

12. The door handle according to claim 11, wherein each of the first sensor electrodes is divided into two divided first sensor electrodes, and each of the plurality of the second sensor electrodes is arranged between two of the divided first sensor electrodes.

13. The door handle according to claim 8, wherein the substrate is divided into a first region and a second region in a transverse direction of the substrate by at least one first sensor electrode, and the plurality of the second sensor electrodes are arranged in each of the first region and the second region.

14. The door handle according to claim 8, wherein each of the plurality of the second sensor electrodes is surrounded by the at least one first sensor electrode.

15. A door handle comprising,
a capacitance sensor configured to detect an operation body, wherein the capacitance sensor includes:
a substrate formed of an insulator and having a surface;
at least one first sensor electrode disposed on the surface of the substrate;
a plurality of second sensor electrodes disposed on the surface of the substrate; and a controller, wherein a number of the plurality of second sensor electrodes is greater than a number of the at least one first sensor electrode, wherein the controller applies a voltage to the plurality of second sensor electrodes and detects a coordinate position of the operation body, in a case where a capacitance between the operation body and the at least one first sensor electrode is greater than or equal to a predetermined value, and wherein, in a case where the capacitance between the operation body and the at least one first sensor electrode is less than the predetermined value, the controller applies the voltage to the plurality of second sensor electrodes, and performs calibration such that capacitance values at the plurality of second sensor electrodes are consistent.

16. The door handle according to claim 15, wherein, in the case where the capacitance between the operation body and the at least one first sensor electrode is less than the predetermined value, the controller does not apply the voltage to the plurality of second sensor electrodes except when the controller performs the calibration.

* * * * *